(12) United States Patent
Alissa et al.

(10) Patent No.: US 10,750,637 B1
(45) Date of Patent: Aug. 18, 2020

(54) IMMERSION COOLING INFRASTRUCTURE MODULE HAVING COMPUTE DEVICE FORM FACTOR

(71) Applicant: Microsoft Technology Licensing, LLC, Redmond, WA (US)

(72) Inventors: Husam Alissa, Redmond, WA (US); Nicholas Andrew Keehn, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/662,348

(22) Filed: Oct. 24, 2019

(51) Int. Cl.
*H05K 7/20* (2006.01)

(52) U.S. Cl.
CPC ..... *H05K 7/20236* (2013.01); *H05K 7/20272* (2013.01); *H05K 7/20781* (2013.01)

(58) Field of Classification Search
CPC ........... H05K 7/20236; H05K 7/20272; H05K 7/20781; H05K 7/203; H05K 7/20772; H05K 7/20836; H05K 7/2079; H05K 7/20809; H05K 7/20818; H05K 7/20281; H05K 7/20327; H05K 7/20763; H05K 7/20218; H05K 7/20263; H05K 7/20736; H05K 7/20; H05K 7/20727; H05K 2201/064; H05K 5/067; G06F 1/20; G06F 2200/201; F28D 1/02; F28D 1/0206; F28D 1/0213; Y02D 10/16
See application file for complete search history.

(56) References Cited

U.S. PATENT DOCUMENTS

| | | | |
|---|---|---|---|
| 9,144,179 B2* | 9/2015 | Shelnutt | H05K 7/203 |
| 10,136,554 B2* | 11/2018 | Chainer | H05K 7/2029 |
| 10,568,234 B1* | 2/2020 | Mao | H05K 7/20272 |
| 2009/0126910 A1* | 5/2009 | Campbell | H05K 7/20781 |
| | | | 165/104.33 |
| 2011/0132579 A1* | 6/2011 | Best | H05K 7/20763 |
| | | | 165/104.31 |
| 2014/0307384 A1* | 10/2014 | Best | H05K 7/20781 |
| | | | 361/679.53 |
| 2014/0362527 A1* | 12/2014 | Best | H05K 7/20236 |
| | | | 361/679.53 |
| 2015/0000319 A1* | 1/2015 | Smith | H05K 7/20218 |
| | | | 62/260 |

(Continued)

*Primary Examiner* — Jayprakash N Gandhi
*Assistant Examiner* — Michael A Matey
(74) *Attorney, Agent, or Firm* — Watson Patents, PLC; Vladan M. Vasiljevic

(57) ABSTRACT

A removable immersion cooling infrastructure module can have a form factor equivalent to that of one or more of the computing devices being cooled by immersion cooling, thereby enabling the immersion cooling infrastructure module to be installed and removed in the same simplified and efficient manner. Moreover, the quantity of immersion cooling infrastructure modules can be varied depending on need, since the immersion cooling infrastructure modules and computing devices can be interchangeable within the openings designed to house the computing devices. An immersion cooling infrastructure module can comprise a filter, a pump that can circulate the immersion cooling liquid through the filter, a power supply and a controller, with the module receiving power, and, optionally, communications and other like connectivity, from the same source as the computing devices.

20 Claims, 8 Drawing Sheets

(56) References Cited

U.S. PATENT DOCUMENTS

| | | | |
|---|---|---|---|
| 2015/0334880 A1* | 11/2015 | Best | H05K 7/20763 |
| | | | 361/679.47 |
| 2016/0286694 A1* | 9/2016 | Krishnan | H05K 7/20772 |
| 2016/0330865 A1* | 11/2016 | Mathew | H05K 7/20236 |
| 2017/0156233 A1* | 6/2017 | Moss | H05K 7/20818 |
| 2017/0179551 A1* | 6/2017 | Shepard | H01M 10/6568 |
| 2017/0265328 A1* | 9/2017 | Sasaki | H05K 7/20236 |
| 2017/0265336 A1* | 9/2017 | Ichinose | H05K 7/20772 |
| 2017/0280587 A1* | 9/2017 | Watanabe | H01L 23/473 |
| 2017/0303442 A1* | 10/2017 | Smith | H05K 7/20809 |
| 2017/0303443 A1* | 10/2017 | Inano | H05K 7/2079 |
| 2017/0311484 A1* | 10/2017 | Ozyalcin | H01L 23/427 |
| 2017/0354066 A1* | 12/2017 | Kodama | H05K 7/20818 |
| 2018/0063991 A1* | 3/2018 | Hirai | H05K 7/20272 |
| 2018/0098464 A1* | 4/2018 | Ishinabe | H05K 7/20781 |
| 2018/0153058 A1* | 5/2018 | Hirai | H05K 7/20781 |
| 2018/0343774 A1* | 11/2018 | Smith | H05K 7/20318 |
| 2019/0098796 A1* | 3/2019 | Wakino | G06F 1/20 |
| 2019/0159359 A1* | 5/2019 | Tung | H05K 7/20209 |
| 2019/0200483 A1* | 6/2019 | Tian | H05K 7/203 |
| 2019/0219311 A1* | 7/2019 | Smith | F25B 30/06 |
| 2019/0281727 A1* | 9/2019 | Fujiwara | H05K 7/20272 |
| 2019/0357385 A1* | 11/2019 | Miyazaki | H05K 7/20236 |
| 2019/0364693 A1* | 11/2019 | Nishiyama | H05K 7/20236 |
| 2019/0394900 A1* | 12/2019 | Inano | H05K 7/20236 |
| 2020/0015383 A1* | 1/2020 | Gao | H05K 7/20763 |
| 2020/0025451 A1* | 1/2020 | Stone | H05K 7/203 |

* cited by examiner

IMMERSION COOLING INFRASTRUCTURE MODULE HAVING COMPUTE DEVICE FORM FACTOR

BACKGROUND

Increasingly, computing functionality need not be supported by hardware that is physically co-located with a user utilizing such computing functionality, but rather can be supported by networked computing hardware aggregated into large data centers that are physically remote from the user. Often, the utilization of such computing functionality is referred to as "cloud computing" and can provide users with computing functionality that is typically supported by virtual machines hosted by large collections of computing hardware providing stability, redundancy, and high availability.

A modern data center represents a large financial investment, both in computing device hardware, and also in the hardware providing the relevant infrastructure systems for such computing devices. For example, data centers often comprise climate control hardware, redundant power systems, physical security, and other like infrastructure systems, in addition to the computing device hardware itself, which can comprise thousands of computing devices, storage devices, networking devices, and other like computing device hardware. Often, computing device hardware is housed in physical structures known as "racks".

Computing devices produce heat as a byproduct of performing computer processing. In datacenters, where many thousands of such computing devices can be co-located within a single space, the amount of heat generated can be very large, and can limit the quantity of processing performed. More specifically, the processors of the computing devices of a data center may not be able to operate at their highest computational throughput levels without exceeding the ability of the data center infrastructure hardware to properly remove the heat that would be generated in such instances. Since computing devices represent a sunk cost, then, to the extent that they can be utilized to perform greater processing, which can, in turn, be sold to consumers, the data center can become more profitable.

One mechanism for addressing the thermal challenges of operating high-performance computing devices, including in data center contexts, can be to immerse some or all of the computing devices into an immersion cooling liquid which can transfer heat more efficiently away from processors and other like heat-generating components of computing devices. Immersion cooling techniques can include two-phase immersion cooling, where the immersion cooling liquid transitions to a gaseous state at temperatures commonly reached by relevant computing components, such as central processing units, graphics processors and the like. The phase change between a liquid and gas, by the immersion cooling liquid, can absorb more heat, and can, thereby, more effectively transfer heat away from the heat-generating components of computing devices. In some instances, a two-phase immersion cooling system can transfer an order of magnitude or more heat away from heat-generating components of computing devices than traditional air-cooling mechanisms.

Unfortunately, immersion cooling mechanisms can be costly to implement. One source of increased cost can be the tank that can house the immersion cooling liquid and the computing devices cooled thereby. Such tanks can comprise pumps, filters and other like immersion cooling infrastructure, some of which can have limited reliability or a limited service life and can, therefore, require repair or replacement that can negatively impact the availability of the entire tank, rending the computing devices cooled thereby inoperable for extended periods of time. Because the repair or replacement of such immersion cooling infrastructure can take substantial time, tanks are typically provided with redundant immersion cooling infrastructure to avoid the aforementioned downtime but at an increased purchase and manufacturing cost.

SUMMARY

A removable immersion cooling infrastructure module can house immersion cooling infrastructure, thereby separating the infrastructure that may need to be repaired or replaced from the immersion cooling tank itself, facilitating the repair or replacement of such infrastructure and avoiding downtime of the cooling infrastructure as a whole, and, thereby, avoiding associated downtime of the computing devices cooled thereby. The immersion cooling infrastructure module can have a form factor equivalent to that of one or more of the computing devices being cooled by immersion cooling, thereby enabling the immersion cooling infrastructure module to be installed and removed in the same simplified and efficient manner with which the computing devices are installed and removed. Moreover, the quantity of immersion cooling infrastructure modules can be varied depending on need, since immersion cooling infrastructure modules and computing devices can be interchangeable within the openings designed to house the computing devices. An immersion cooling infrastructure module can comprise a filter to filter out particulates, contaminants and other like undesirable materials from the immersion cooling liquid. An immersion cooling infrastructure module can further comprise a pump that can circulate the immersion cooling liquid through the filter. A power supply and controller can likewise be part of the immersion cooling infrastructure module, with the module receiving power, and, optionally, communications and other like connectivity, from the same source as the computing devices. The immersion cooling infrastructure module can be physically sized to allow for the installation of computing devices, or other devices, alongside it within a single opening, or can comprise computing devices or computing device hardware within space available on the immersion cooling infrastructure module.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Additional features and advantages will be made apparent from the following detailed description that proceeds with reference to the accompanying drawings.

DESCRIPTION OF THE DRAWINGS

The following detailed description may be best understood when taken in conjunction with the accompanying drawings, of which.

DETAILED DESCRIPTION

The following description relates to immersion cooling infrastructure module that can provide immersion cooling infrastructure within a computing device form factor, allowing the immersion cooling infrastructure to be removable and, thereby, separating the infrastructure that may need to be repaired or replaced from the immersion cooling tank itself. The immersion cooling infrastructure module can have a form factor equivalent to that of one or more of the computing devices being cooled by immersion cooling, thereby enabling the immersion cooling infrastructure module to be installed and removed in the same simplified and efficient manner with which the computing devices are installed and removed. Moreover, the quantity of immersion cooling infrastructure modules can be varied depending on need, since the immersion cooling infrastructure modules and computing devices can be interchangeable within the openings designed to house the computing devices. An immersion cooling infrastructure module can comprise a filter to filter out particulates, contaminants and other like undesirable materials from the immersion cooling liquid. An immersion cooling infrastructure module can further comprise a pump that can circulate the immersion cooling liquid through the filter. A power supply and controller can likewise be part of the immersion cooling infrastructure module, with the module receiving power, and, optionally, communications and other like connectivity, from the same source as the computing devices. The immersion cooling infrastructure module can be physically sized to allow for the installation of computing devices, or other devices, alongside it within a single opening, or can comprise computing devices or computing device hardware within space available on the immersion cooling infrastructure module.

As utilized within this application, the term "infrastructure module" means a physical structure having devices that provide resources utilized by computing devices, which are physically distinct and separate from the infrastructure module, and/or improve the operating environment of computing devices, which, again, are physically distinct and separate from the infrastructure module. The resources and/or environmental improvements provided by an "infrastructure module", as explicitly defined above, are provided to, and primarily utilized by, computing devices that are physically distinct and separate from the infrastructure module. Thus, as explicitly defined above, the term "infrastructure module" does not include computing devices whose hardware only affects the resources and environment of the host computing device housing or otherwise containing such hardware, and whose effect beyond such host computing device is only ancillary.

Figure 1:
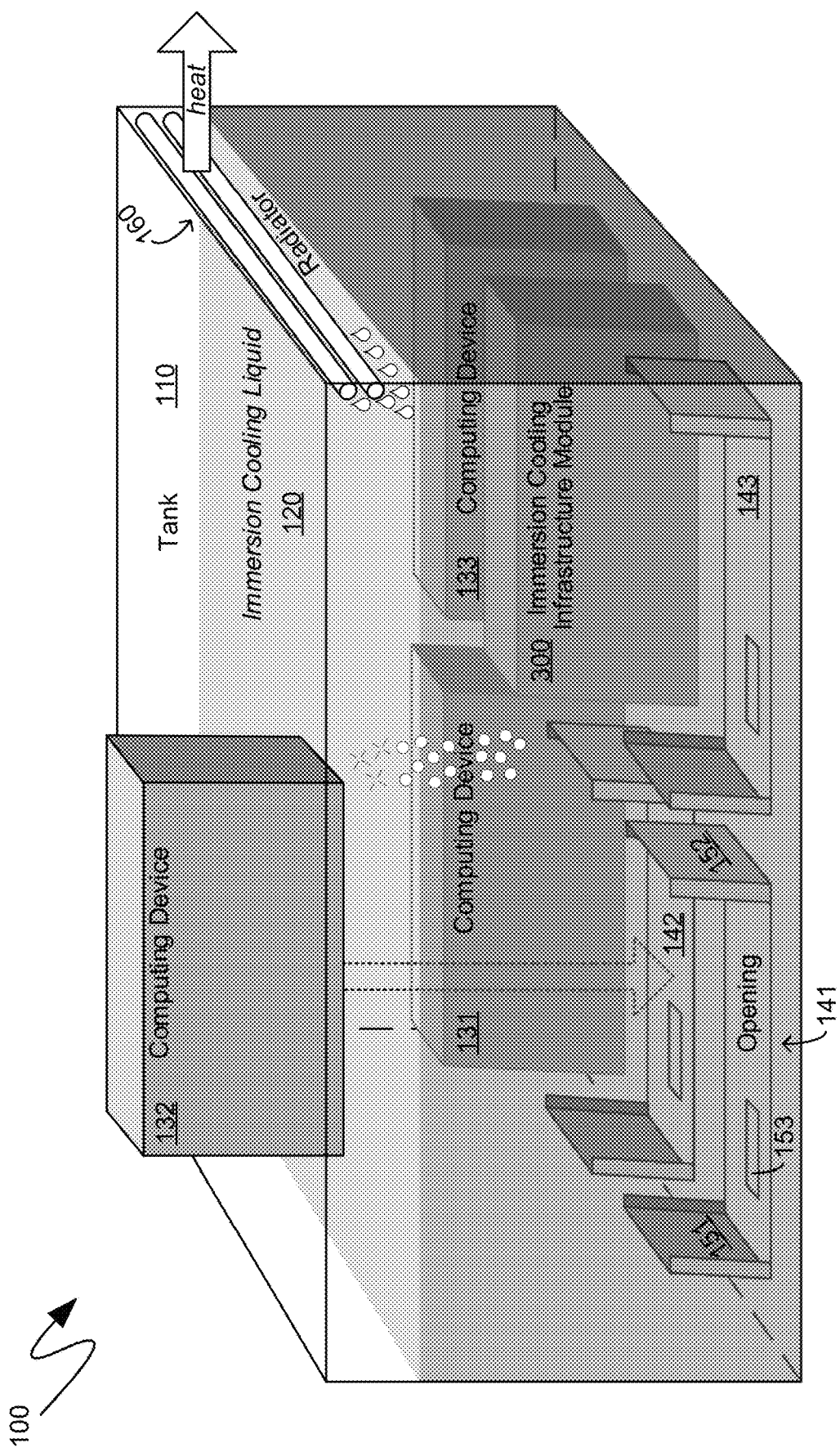
FIG. 1 is a diagram of an exemplary immersion cooling system comprising an immersion cooling infrastructure module.

With reference to FIG. 1, an exemplary system 100 is illustrated, providing context for the descriptions below. The exemplary system 100 includes a tank, such as the exemplary tank 110, which can house an immersion cooling liquid, such as the exemplary immersion cooling liquid 120. The exemplary system 100 can further include one or more computing devices, such as the exemplary computing devices 131 and 133, which can be at least partially, if not fully, immersed in the immersion cooling liquid 120 inside the tank 110. As illustrated in FIG. 1, heat from computing devices, such as the exemplary computing device 131, can be absorbed by the immersion cooling liquid 120, thereby removing the heat generated by various components of the exemplary computing device 131, such as the central processing units, graphics processing units, and other like heat-generating computing hardware. If the exemplary immersion cooling liquid 120 is a two-phase immersion cooling liquid, then the absorption of the heat, from the heat-generating computing hardware of the computing device 131, can cause the exemplary immersion cooling liquid 120 to perform a phase change from a liquid to a gas, as illustrated by the bubbles shown in FIG. 1. Such a phase change can absorb a greater quantity of heat, and can enable a two-phase immersion cooling liquid to more effectively conduct heat away from computing devices than a single phase immersion cooling liquid that does not change phase. According to one aspect, one or more radiators, such as the exemplary radiator 160, or other like cooling apparatus, can be installed near the top of the tank 110. As the immersion cooling liquid is evaporated by the heat of the computing devices, it can cool on the radiator, such as the exemplary radiator 160, and perform a phase change back into a liquid and precipitate back into the tank 110, as illustrated by the droplets shown in FIG. 1. The heat absorbed by the radiator, such as the exemplary radiator 160, can then be further removed by traditional cooling mechanisms, such as venting, airflow, air-conditioning, and other like cooling mechanisms.

The utilization of an immersion cooling setup, such as that illustrated in FIG. 1, can utilize immersion cooling infrastructure to maintain optimal performance of the immersion cooling setup. Such immersion cooling infrastructure can include filters that can filter the immersion cooling liquid 120 to remove particulates, contaminants, and other like undesirable elements from the immersion cooling liquid 120, thereby preventing such undesirable elements from negatively impacting the performance of the computing devices, such as the exemplary computing devices 131 and 133, the heat transfer capabilities of the immersion cooling liquid, such as the exemplary immersion cooling liquid 120, or combinations thereof. Immersion cooling infrastructure can further include pumps or other like liquid-moving mechanisms that can force liquid, such as the exemplary immersion cooling liquid 120, through the aforementioned filters. Additional immersion cooling infrastructure can include the provision of power and control mechanisms, including sensing and monitoring equipment, to such pumps and filters.

Filters may need to be replaced on a periodic and/or as needed basis. Additionally, pumps may require servicing, again on a periodic and/or as needed basis. According to one aspect, to facilitate the removal and replacement of immersion cooling infrastructure, such immersion cooling infrastructure can be packaged into an immersion cooling infrastructure module that can have a form factor equivalent to that of the computing devices and can be installed in a same manner as those computing devices. For example, the exemplary system 100 shown in FIG. 1 illustrates an immersion cooling infrastructure module, in the form of the exemplary immersion cooling infrastructure module 300, installed within the same kind of openings as the exemplary computing devices 131 and 133.

More specifically, computing devices, such as computing devices in a data center, are often installed within a rack, or other like frame or support system that can accommodate, support and house multiple computing devices, such as the exemplary computing device 131 and 133. Air-cooled server racks can conform to various standards such as the EIA-310 standard, the IEC 60297 standard, and other like standards. As will be recognized by those skilled in the art, such standards typically define rack frames that are 19 or 23 inches wide and have mounting holes to accommodate equipment that is a multiple of approximately 1.75 inches high. Computing equipment designed to be mounted in such racks is often referenced based on the height of such equipment as being a multiple of the "rack unit", often abbreviated by the letter "U". Thus, for example, computing equipment can be referenced as being "1U", "2U", and so forth. Additionally, rack themselves are often referenced based on the total height of the computing equipment that can be installed in such a rack, such as a "42U" or "48U" rack.

In an immersion cooling setup, different standards may be established, but the principles remain the same in that predefined measurements can define the relevant size and shape of both the openings into which computing devices are inserted, the computing devices themselves, and any associated attachment or connection mechanisms, such as screws, clips, connectors, plugs, and other like connection mechanisms. Within the exemplary system 100 shown in FIG. 1, the exemplary tank 110 illustrates multiple openings, such as the exemplary openings 141, 142 and 143 into which computing devices can be installed. For example, the exemplary opening 141 is illustrated as comprising brackets, guides, or other like structures in the form of the structures 151 and 152 that can define the opening 141 and enable it to receive an appropriately sized computing device. The exemplary opening 141 can further comprise a connection 153 that can facilitate the provision of power to the computing devices. Exemplary connection 153 can further include networking connections, peripheral connections, and other like connections. As illustrated in FIG. 1, a computing device, such as the exemplary computing device 132 can be inserted into an opening, such as the exemplary opening 142, and can, thereby, be installed within the tank 110 and rendered operational, such as through the provision of power, networking, and other like capabilities via the connection facilitated by the opening 142. The openings, such as the exemplary openings 141, 142 and 143, can be built into the tank 110, or can be part of a removable superstructure, which can be separate, or at least separable, from the tank 110.

According to one aspect, an immersion cooling infrastructure module, such as the exemplary immersion cooling infrastructure module 300, can have a similar size and shape to that of the computing devices, such as the exemplary computing devices 131, 132 and 133. In such a manner, an immersion cooling infrastructure module, such as the exemplary immersion cooling infrastructure module 300, can be installed and removed as easily as one or more of the computing devices. Moreover, mechanisms utilized to install or remove the computing devices, including automated mechanisms such as robot arms and the like, can be utilized to install or remove immersion cooling infrastructure modules without modification.

The ease with which an immersion cooling infrastructure module, such as the exemplary immersion cooling infrastructure module 300, can be removed, and subsequently reinstalled, can facilitate the repair or replacement of any immersion cooling infrastructure found therein. More specifically, the immersion cooling infrastructure module, such as the exemplary immersion cooling infrastructure module 300, can be removed from an operating environment, such as from inside the immersion cooling liquid 120 in the tank 110, and can be moved to a more convenient location, such as a workbench, or even an off-site location, where repair or replacement of the immersion cooling infrastructure components found therein can be accomplished more quickly and more efficiently. Once such a repair or replacement is completed, the immersion cooling infrastructure module can be returned to service, either in the same tank from which it was removed, or in a different tank, such as the next subsequent tank to need a new immersion cooling infrastructure module.

Another advantage can be that the openings, such as the exemplary openings 141, 142 and 143 can be standardized, and the tank 110 need not comprise any special or dedicated fitments, openings, or other like provisions for immersion cooling infrastructure, such as pumps, filters, power supplies, controllers, and other like immersion cooling infrastructure. Consequently, a tank, such as the exemplary tank 110, can be a commodity component whose price can be driven downward through competition, but which can remain compatible with different types of immersion cooling infrastructure, so long as such immersion cooling infrastructure is packaged within an immersion cooling infrastructure module such as that detailed herein. Analogously, competition among immersion cooling infrastructure manufacturers, such as pump manufacturers, filter manufacturers, and the like, can increase the quality, or decrease the price, of those components, and those components can be retrofit onto existing tanks, such as the exemplary tank 110, without change or modification required to the tank. In such a manner, existing hardware, including computing hardware, and the overall cooling infrastructure, can receive the benefit of updates to one or more specific immersion cooling infrastructure components.

Yet another advantage can be that necessary redundancy of immersion cooling infrastructure can be achieved with fewer components because a single spare immersion cooling infrastructure module can provide redundant immersion cooling infrastructure to multiple tanks, such as the exemplary tank 110. For example, with immersion cooling infrastructure that is more difficult, or impossible, to remove from a tank, redundancy can be achieved only with multiple immersion cooling infrastructure components, such as multiple filters, or multiple pumps, being installed within each tank. Thus, as a simple example, a data center with one hundred tanks may have to purchase as many as two hundred pumps, filters, or other like immersion cooling infrastructure components, since each tank can comprise a primary immersion cooling infrastructure component, and the secondary one to provide redundancy. By contrast, an immersion cooling infrastructure module, such as the exemplary immersion cooling infrastructure module 300, which can be easily removed and inserted utilizing the openings designed for computing devices, can enable a data center to keep only a couple of "hot spares" of such immersion cooling infrastructure modules. Thus, returning to the simple example above, a data center with one hundred tanks may need as few as one hundred and one immersion cooling infrastructure modules, with one hundred being installed in the one hundred tanks, and the one remaining as a spare to be inserted into any tank whose immersion cooling infrastructure module has failed, is operating improperly, requires service, or the like. So long as only one such immersion cooling infrastructure module fails or requires service at any one time, redundancy can be maintained with only one additional spare.

Yet another advantage can be that the immersion cooling infrastructure module can be inserted in any one of multiple different locations, or openings, such as the exemplary openings 141, 142 and 143, allowing immersion cooling infrastructure modules to be moved around within an environment, such as within the exemplary tank 110, based upon theoretical or empirical data, or the current filtering, or other like infrastructure, needs. Similarly, multiple immersion cooling infrastructure modules can be temporarily installed within a tank, such as during periods when additional filtering may be required, such as when new computing hardware is introduced to the tank. Subsequently, once a need for additional filtering, or other like increased infrastructure need, has ended, one or more of the immersion cooling infrastructure modules that were temporarily installed, can be removed.

Figure 2:
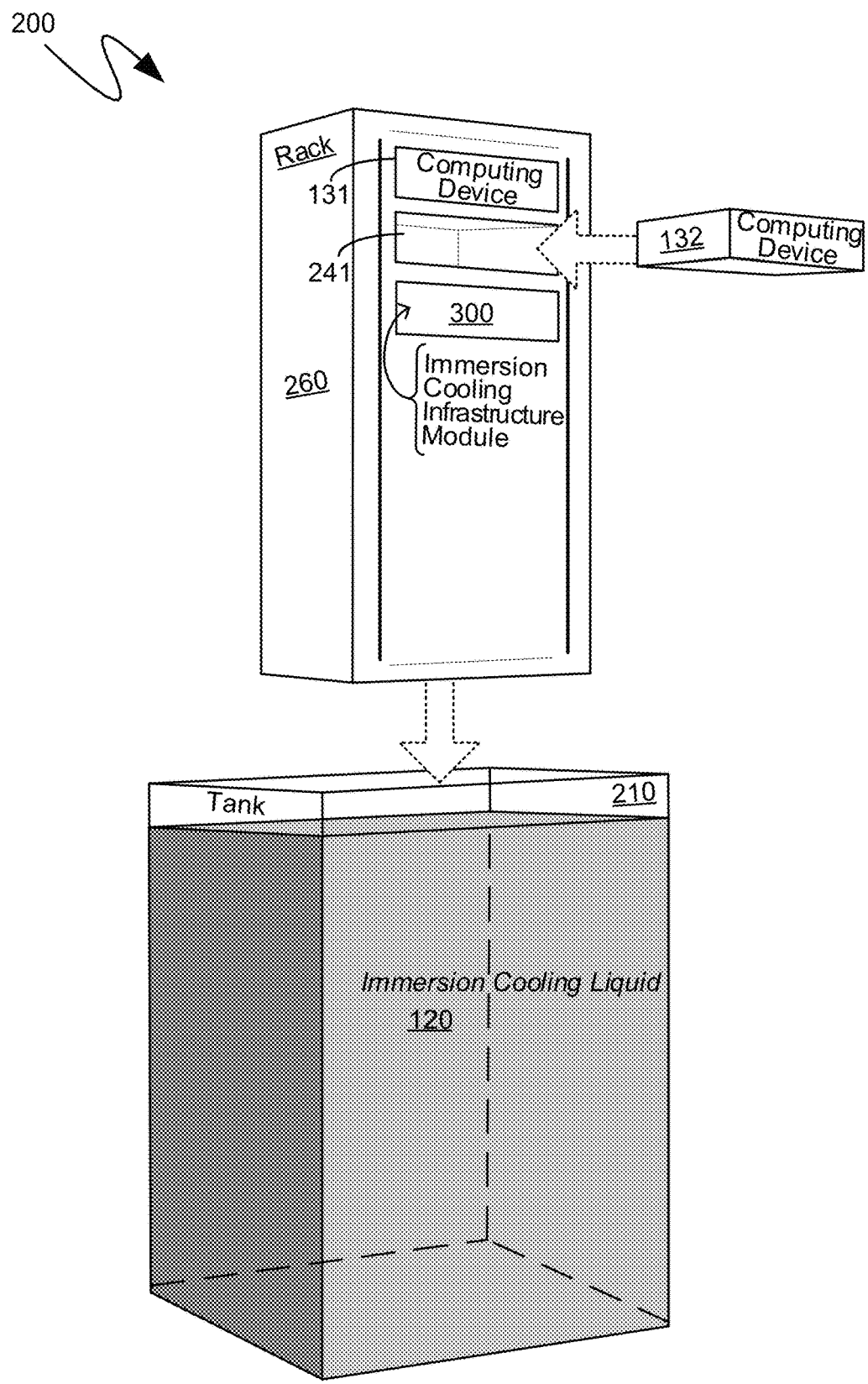
FIG. 2 is a diagram of another exemplary immersion cooling system comprising an immersion cooling infrastructure module.

As can be seen, numerous advantages flow from the packaging of immersion cooling infrastructure into a module that comprises a size, shape, and attachment and connection capability as a computing device. The exemplary system 100 shown in FIG. 1 is meant to be strictly illustrative, as different types of systems may have different openings, with different sizes, different orientations, and such openings may or may not comprise brackets, guides, prongs, plugs, or other like structures analogous to those shown in FIG. 1. For example, the exemplary system 200 of FIG. 2 illustrates an embodiment in which the openings, such as the exemplary opening 241, are horizontal, instead of the vertical orientation shown in the exemplary system 100 of FIG. 1. Additionally, in the exemplary system 200 of FIG. 2, the openings can be part of a rack, or other like structure, that can be separate, or separable, from the tank itself In the exemplary system 200 of FIG. 2, computing devices, such as the exemplary computing devices 131 and 132, described above, and immersion cooling infrastructure modules, such as the exemplary immersion cooling infrastructure module 300, which will be detailed further below, can be inserted and removed horizontally, instead of the vertical insertion and removal illustrated in the exemplary system 100 of FIG. 1. More specifically, the computing devices an immersion cooling infrastructure module can be horizontally inserted into a structure, such as the exemplary rack 260, such as illustrated in the exemplary system 200 of FIG. 2. The structure, such as the exemplary rack 260, can then be immersed in a tank, such as the exemplary tank 210, comprising the exemplary immersion cooling liquid 120, detailed above. Such an immersion can be due to the insertion of the rack 260 into the tank 210 in a vertical manner.

Figure 3:
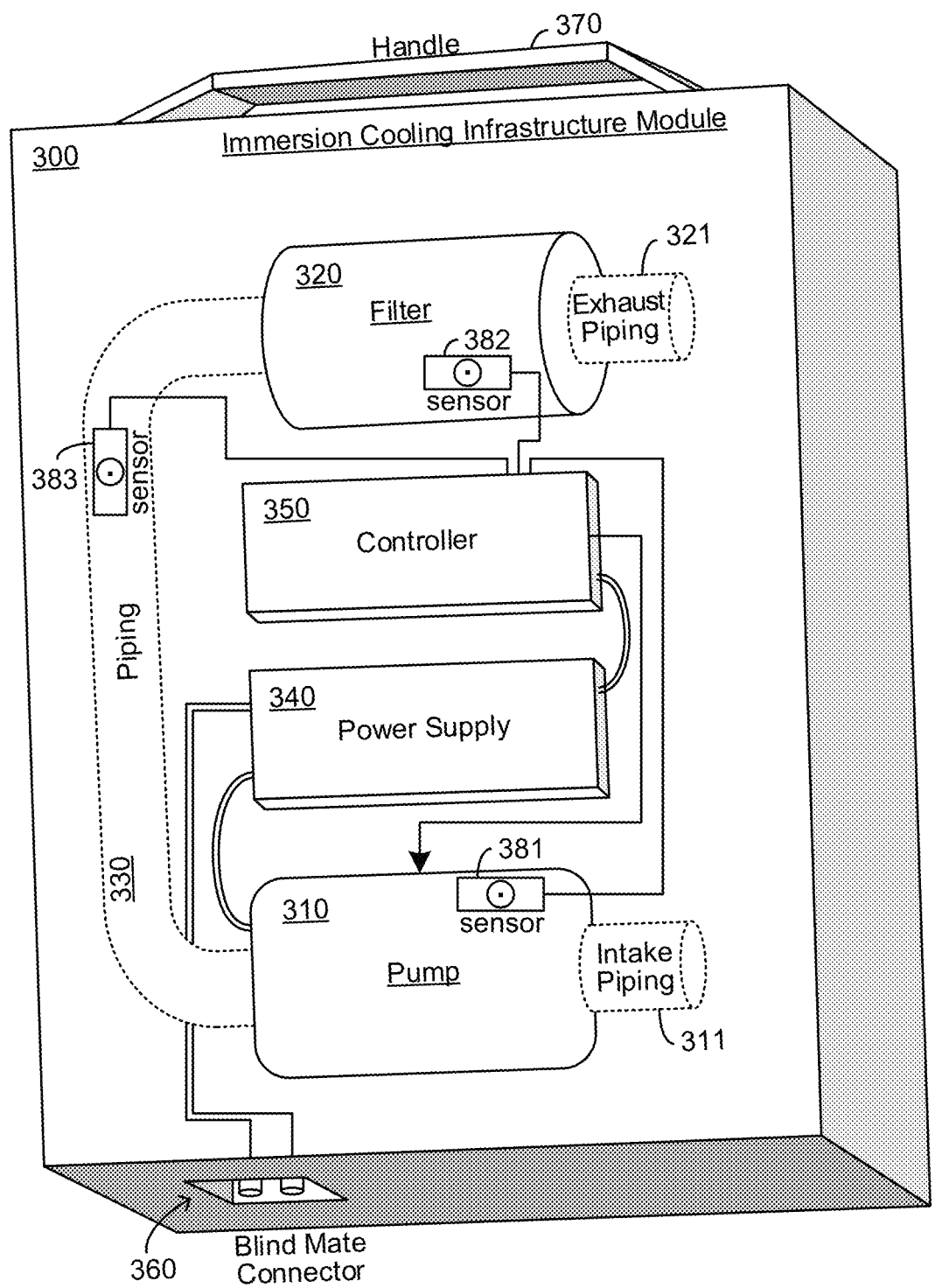
FIG. 3 is a diagram of an exemplary immersion cooling infrastructure module having a compute device form factor.

Turning to FIG. 3, the exemplary immersion cooling infrastructure module 300 is illustrated in greater detail. According to one aspect, an immersion cooling infrastructure module, such as the exemplary immersion cooling infrastructure module 300, can comprise a filter for filtering the immersion cooling liquid, such as the exemplary filter 320. The filter 320 can be any filtering structure appropriate for filtering the immersion cooling liquid, including, for example, paper filters, stainless steel mesh filters, woven filters, fiberglass filters, and the like, and can be in any appropriate physical form, including spiral filters, pleated filters, conical filters and the like.

To facilitate the passage of the immersion cooling liquid through the filter, such as the exemplary filter 320, the immersion cooling infrastructure module 300 can comprise a pump, such as the exemplary pump 310. The pump 310 can be any pump appropriate for filtering the immersion cooling liquid. Because of the viscosity of certain types of immersion cooling liquid, some types of pumps may be preferable. For example, if the immersion cooling liquid has a low viscosity, then peristaltic pumps may be more effective than, for example, rotary pumps. According to one aspect, the pump, such as the exemplary pump 310, can be positioned deeper within the immersion cooling liquid. Thus, for example, the pump can be located within a (gravitationally oriented) lower portion of the immersion cooling infrastructure module, such as in the manner illustrated in the exemplary immersion cooling infrastructure module 300 shown in FIG. 3.

By contrast, the filter, such as the exemplary filter 320, can be positioned, within the immersion cooling infrastructure module, to be more easily visible or more easily replaced. In such an instance, if the immersion cooling infrastructure module 300 is vertically inserted and removed into the tank, then the filter, such as the exemplary filter 320, can be located within a vertically oriented higher or upper portion of the immersion cooling infrastructure module, such as in the manner illustrated in the exemplary immersion cooling infrastructure module 300 shown in FIG. 3. If the immersion cooling infrastructure module was horizontally inserted, such as in the manner illustrated in FIG. 2, then the filter, such as the exemplary filter 320, could be positioned to be more easily visible, such as towards a front of the immersion cooling infrastructure module.

Piping, such as the exemplary piping 330, can connect a pump, such as the exemplary pump 310, to a filter, such as the exemplary filter 320, thereby facilitating the pump's circulation of the immersion cooling liquid through the filter 320 if the pump are the filter are located in physically distinct locations within the immersion cooling infrastructure module. According to one aspect, the filter can be integrated within the pump, such as externally attached to the pump, without the piping 330, or internally positioned within the pump housing. In such instances, the piping 330 may not be necessary. Accordingly, to illustrate that the piping 330 is an optional component, the piping 330 is shown in FIG. 3 with dashed lines.

In a similar manner, intake piping, such as the exemplary intake piping 311, can facilitate the pump's receipt of immersion cooling liquid. Thus, for example, the exemplary intake piping 311 can extend beyond the edges of the immersion cooling infrastructure module 300, can be routed to a lower portion of the tank within which the immersion cooling infrastructure module is installed, or can otherwise provide an advantageously located intake of the immersion cooling liquid for the pump 310. In some instances, however, intake piping 311 may not be desirable, or only a short portion of such intake piping may be practical. For example, if the immersion cooling liquid is highly viscous, then the "sucking-in" of such liquid, by the pump 310, can be negatively impacted by an extended amount of intake piping, such as the exemplary intake piping 311. Accordingly, to illustrate that the intake piping 311 is an optional component, the intake piping 311 is shown in FIG. 3 with dashed lines.

Analogously, exhaust piping, such as the exemplary exhaust piping 321, can facilitate the output of filtered immersion cooling liquid, such as by positioning the exhaust of such filtered immersion cooling liquid beyond the edges of the immersion cooling infrastructure module 300, or at another advantageous position within the tank. As with the intake piping, in some instances, exhaust piping 321 may not be desirable, or only a short portion of such piping may be practical. Accordingly, to illustrate that the exhaust piping 321 is an optional component, the exhaust piping 321 is shown in FIG. 3 with dashed lines.

A pump, such as the exemplary pump 310, can be provided with electrical power by a power supply, such as the exemplary power supply 340, that can also be a component of an immersion cooling infrastructure module, such as the exemplary immersion cooling infrastructure module 300 shown in FIG. 3. The power supply, such as the exemplary power supply 340, can also provide power to a controller, such as the exemplary controller 350, which can control the operation of the pump 310, other components of the immersion cooling infrastructure module 300, or other devices external to the immersion cooling infrastructure module 300, such as infrastructure devices that are part of the tank, or installed elsewhere within the tank.

According to one aspect, electrical power can be provided to an immersion cooling infrastructure module, such as the exemplary immersion cooling infrastructure module 300, in a same manner as the provision of electrical power to computing devices. More specifically, a connector, such as the exemplary connector 360, of the immersion cooling infrastructure module 300, can be of the same type as the connectors on the computing devices. One such connector can be a blind mate connector which can facilitate proper connection while the connection is not visible to a user making the connection. For example, a computing device, or the exemplary immersion cooling infrastructure module 300, can be slid into an opening, such as those illustrated previously, and the relevant connections can be on an opposite side from which the computing device is being slid such that visibility of the relevant connections is blocked by the device itself. Accordingly, a blind meet connector can facilitate such connections, including connections for electrical power, connections for networking, computer peripherals, or other like connections. In some instances, the connector 360 of an immersion cooling infrastructure module can comprise only a subset of the connections made available at each opening. For example, each opening in a rack or a tank may comprise connections for electrical power, networking, and other connections, all of which can be mated by corresponding connectors on a computing device. By contrast, in such an example, an immersion cooling infrastructure module may only comprise connectors for meeting with electrical power, or only electrical power and networking. To prevent the immersion cooling liquid from leaking out, a connector, such as the exemplary connector 360, can comprise relevant physical constructs designed to minimize such leaking including gaskets, seals, mating surfaces, and other like liquid barriers.

Electrical power can be provided in the form of traditional 120V or 140V AC power. Alternatively, electrical power can be provided as DC power. Depending on the type of pump, the power supply 340 can be a switching power supply to convert from AC to DC power, a power inverter to convert from DC to AC, a step up or step down converter, or, if the supplied power matches that required by the pump in both kind and quantity, the exemplary power supply 340 can be nothing more than a distribution of that power to the pump 310 and can be as simple as simply the relevant wiring bridging the pump 310 to the connector 360.

Operation of the pump 310 can be controlled by a controller, such as the exemplary controller 350. The functionality and complexity of the exemplary controller 350 can vary depending upon the components being controlled by the controller and the inputs being processed thereby. For example, one simple controller can control the operation of the pump 310 and can monitor the filter 320 to determine whether to increase or decrease the flow generated by the pump, such as based on back pressure being generated by the pump and/or filter. The detection of such back pressure can be performed by various sensors which can be communicationally coupled to the controller 350. The exemplary immersion cooling infrastructure module 300 comprises various exemplary sensors, such as the exemplary sensor 381 that can monitor various aspects of the operation of the pump 310, such as energy consumption, vibration, flow rate, temperature, and other like aspects. The exemplary sensor 382 can similarly monitor various aspects of the filter 320, including quantity of flow through the filter, an optical permeability of the filter, a chemical signature of the filter, or other like aspects. Similarly, the exemplary sensor 383 can monitor various aspects of the flow through the piping 330, including flow rate, back pressure, and other like aspects. The exemplary sensors 381, 382 and 383 are only one example and an immersion cooling infrastructure module can comprise more sensors, different sensors, or may not comprise any such sensors at all, and control of the pump 310 can be performed wholly externally to the immersion cooling infrastructure module. For example, the pump 310 may be controlled by an external controller whose control signals to the pump 310 may be provided through the connector 360.

According to one aspect, an on-board controller, such as the exemplary controller 350, can facilitate communication with processes and components external to the immersion cooling infrastructure module 300. Such communications can be wired, passing through the connector 360, or can be wireless. For example, exemplary controller 350 can control other aspects of the immersion cooling infrastructure, such as the operation of the tank lid, the operation of lights, or other visual equipment, the operation of fans or pumps external to the immersion cooling infrastructure module, and the like. As another example, the exemplary controller 350 can communicate with the controllers of other immersion cooling infrastructure modules to coordinate pump speeds, flow rates or other operational aspects.

To facilitate physical installation and removal, an immersion cooling infrastructure module can comprise handles, grips, alignment aids, or other like physical structures. For example, the exemplary immersion cooling infrastructure module 300 shown in FIG. 3 is illustrated as comprising an exemplary handle 370. Such a handle 370 can be positioned opposite the connector 360 to facilitate inserting or removing the immersion cooling infrastructure module 300 into an opening, such as those described above.

An immersion cooling infrastructure module can, according to one aspect, have an equivalent size and shape to that of computing devices. According to other aspects, the immersion cooling infrastructure module can conform to fractional-width size standards to facilitate the installation of additional devices, such as additional computing devices, within a single opening. As will be recognized by those skilled in the art, within the context of standard rack-mount computing devices, such as those conforming to the standards detailed above, half-width and third-width computing devices and peripherals exist for allowing multiple computing devices within a single standard opening. In an analogous manner, immersion cooling computing setups can likewise utilize fractional-width size standards.

Figure 4:
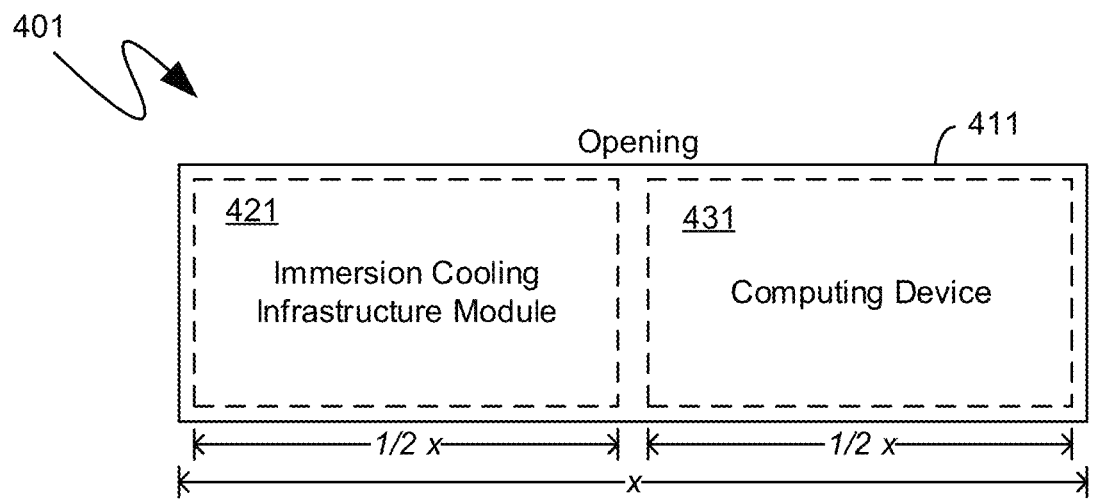
FIG. 4 is a diagram of an exemplary sizing of an exemplary immersion cooling infrastructure module having a compute device form factor.
Figure 4:
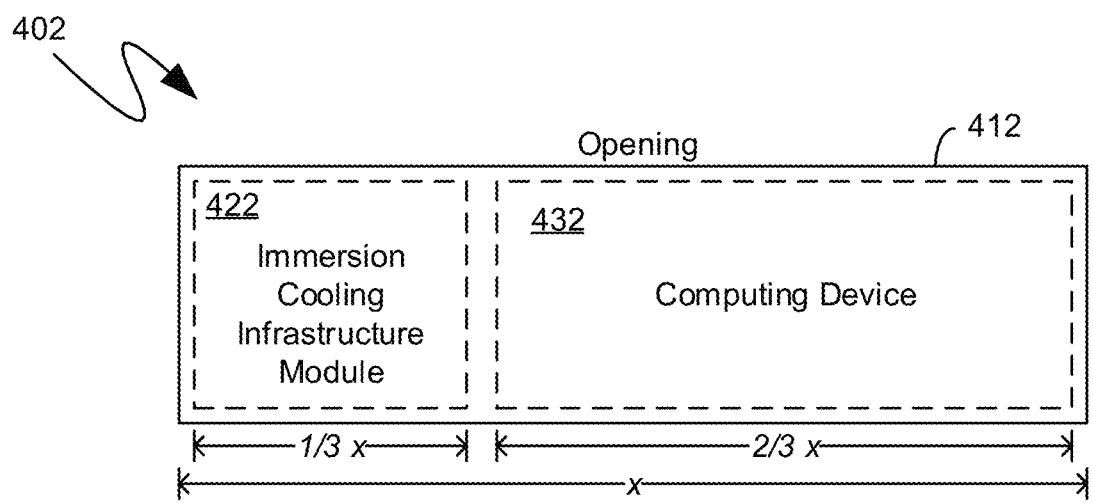

Turning to FIG. 4, the exemplary immersion cooling infrastructure module 421 shown in the system 401 can be a half-width module, which can enable another module, such as the exemplary computing device 431, to be installed alongside the exemplary immersion cooling infrastructure module 421 all within a single standard sized opening, such as the exemplary standard sized opening 411. The exemplary system 402 illustrates an exemplary third-width immersion cooling infrastructure module 422, with a larger computing device, namely the exemplary computing device 432, installed alongside within a single standard sized opening, such as the exemplary standard size opening 412. Although illustrated as being computing devices, the additional devices, such as the exemplary devices 431 and 432, can be additional immersion cooling infrastructure modules.

Figure 5:
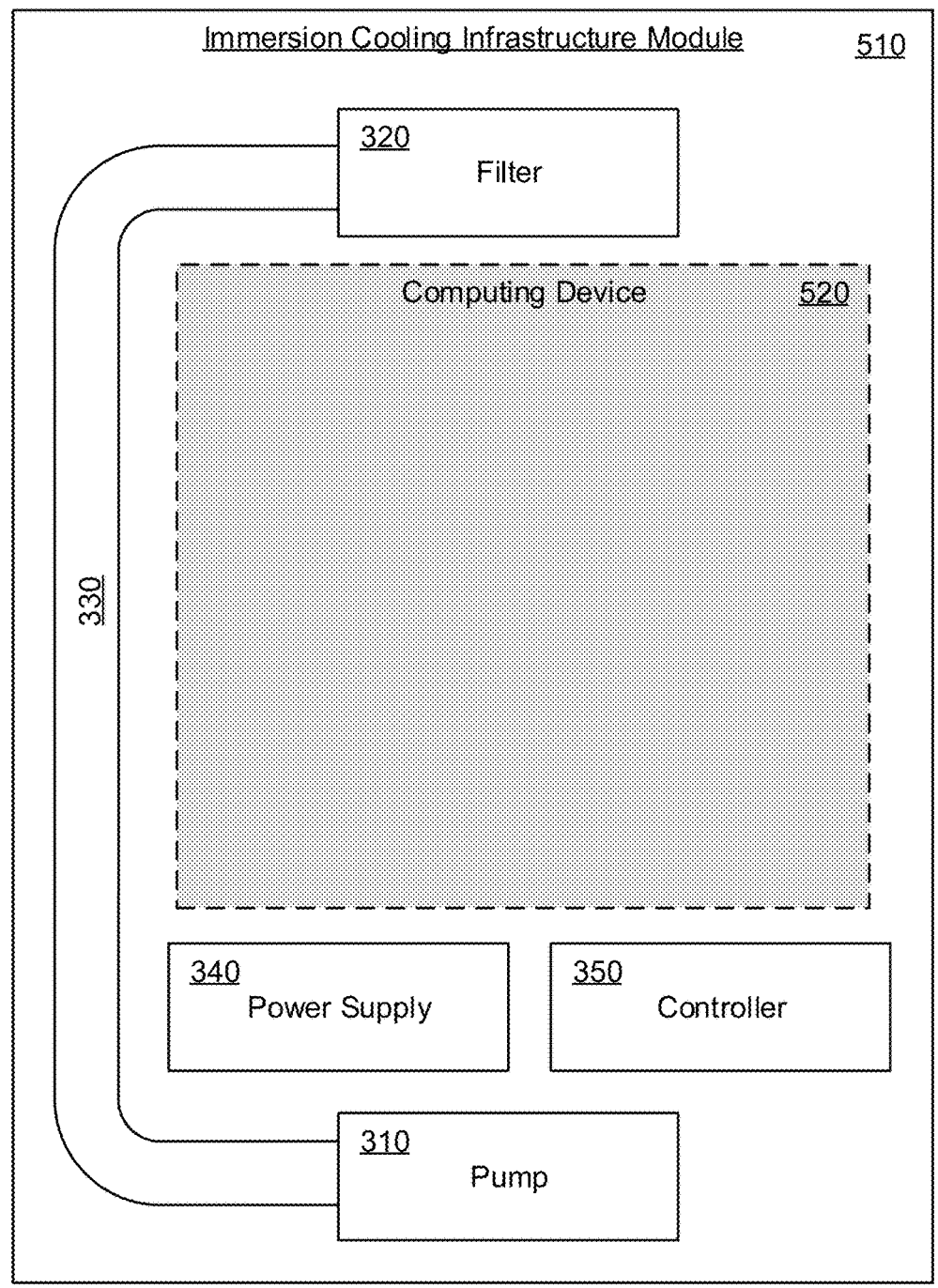
FIG. 5 is a diagram of another exemplary immersion cooling infrastructure module having a compute device form factor.

According to another aspect, a computing device, or peripherals thereof, can be installed or pre-manufactured within the immersion cooling infrastructure module to provide for more efficient use of space within an immersion cooling tank. For example, turning to FIG. 5, the exemplary immersion cooling infrastructure module 510 is illustrated as comprising the pump 310, the filter 320, the piping 330, the power supply 340 and the controller 350 that were detailed above. In addition, the exemplary immersion cooling infrastructure module 510 is shown as comprising a computing device, such as the exemplary computing device 520, within space available in the immersion cooling infrastructure module 510. More specifically, since the immersion cooling infrastructure module 510 can conform to a standard size and shape, the above-described components may not require all of the space available within such a standard size and shape. Accordingly, to provide for more efficient use of space within an immersion cooling setup, a computing device, such as the exemplary computing device 520, can be installed within the immersion cooling infrastructure module 510, with the relevant connections passing through the connector of the immersion cooling infrastructure module. The exemplary computing device 520 can comprise some or all of the components described in detail below with reference to the exemplary computing device 800 shown in FIG. 8. Alternatively, or in addition, computing peripherals, such as hard drives, RAM, and other like peripherals can be installed in the place of the computing device 520 shown in FIG. 5.

Figure 6:
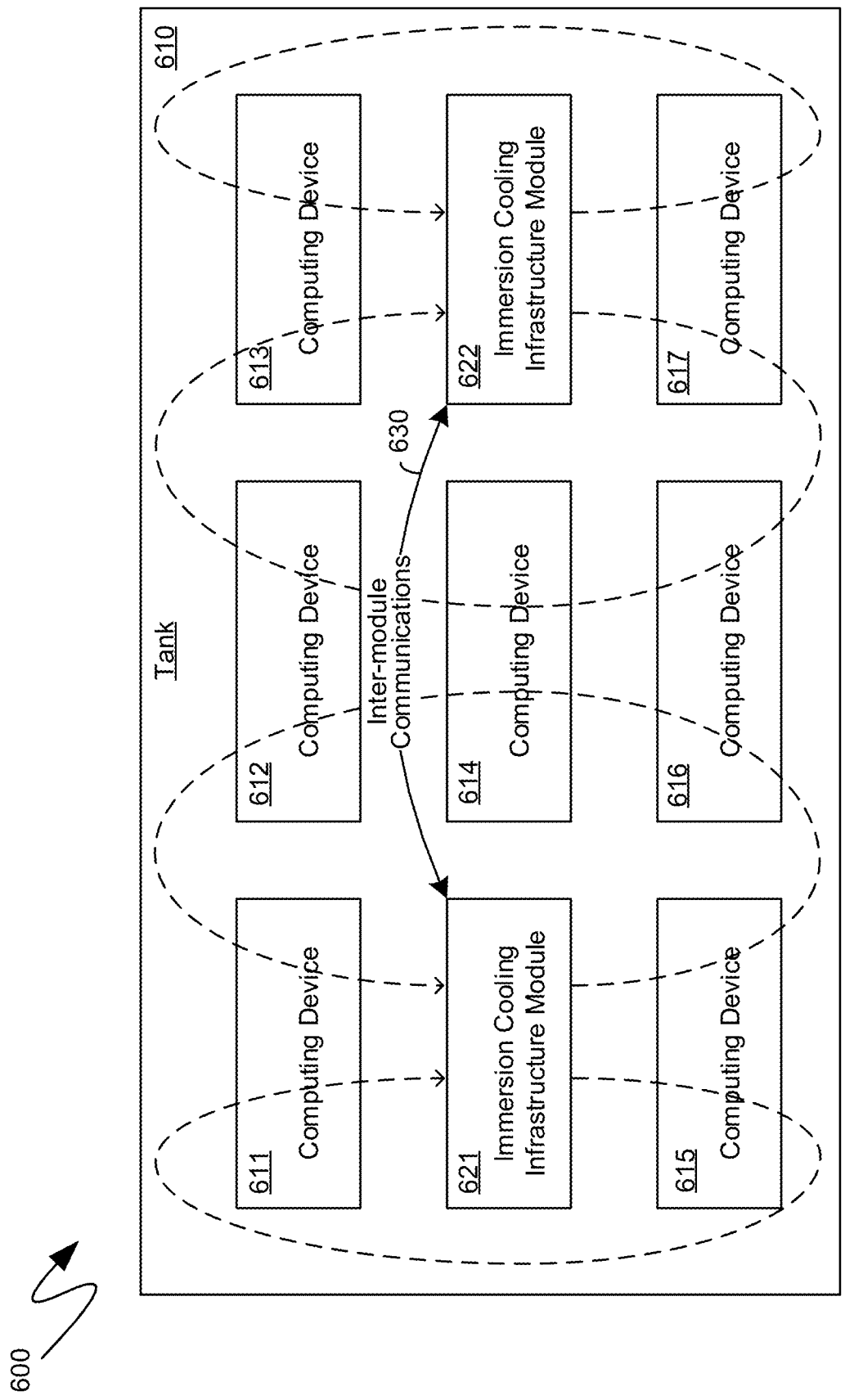
FIG. 6 is a diagram of another exemplary immersion cooling system comprising multiple immersion cooling infrastructure modules.

As indicated previously, the ease with which immersion cooling infrastructure modules can be added or removed enables the functionality provided by such immersion cooling infrastructure modules to be sized based on need. For example, when new computing devices are installed into a tank, a greater quantity of particulates may be generated by such new computing devices. Accordingly, multiple immersion cooling infrastructure modules can be temporarily installed to increase the filtering capacity. For example, the exemplary system 600 shown in FIG. 6 illustrates an exemplary tank 610 comprising two immersion cooling infrastructure modules, such as the exemplary immersion cooling infrastructure module 621 and 622. Such immersion cooling infrastructure modules can generate a flow of immersion cooling liquid, such as is generally illustrated by the dashed lines in FIG. 6. The exemplary tank 610 is also illustrated as comprising computing devices being cooled by the immersion cooling liquid, such as the exemplary computing devices 611, 612, 613, 614, 615, 616 and 617.

According to one aspect, communications between controllers on the immersion cooling infrastructure modules 621 and 622, such as the exemplary inter-module communications 630, can facilitate the coordination of the operation of various immersion cooling infrastructure components, such as the pumps of the immersion cooling infrastructure modules 621 and 622. For example, if the immersion cooling infrastructure module 622 is added after the immersion cooling infrastructure module 621 was already present within the tank 610, discovery protocols can facilitate the determination, such as by the controller of the immersion cooling infrastructure module 621, that a second immersion cooling infrastructure module has been added. Accordingly, the controller of the immersion cooling infrastructure module 621 can adjust the pump speed, such as by decreasing the flow rate through the pump, to accommodate that the second immersion cooling infrastructure module has been added to the tank 610. In a similar manner, the controller of the exemplary immersion cooling infrastructure module 622 can identify the immersion cooling infrastructure module 621 and can obtain therefrom information to coordinate, for example, flow rate, pump speed, or pump direction so that the pumps of both immersion cooling infrastructure modules operate in sync. For example, depending on measurements and orientation, the inter-module communications 630 can cause the immersion cooling infrastructure module 621 to operate its pump in an opposite direction as that of the immersion cooling infrastructure module 622 to facilitate a circular flow. As another example, the inter-module communications 630 can cause the immersion cooling infrastructure module 621 to operate its pump in a same direction as that of the immersion cooling infrastructure module 622 to facilitate a flow analogous to that illustrated in FIG. 6.

Once the need for additional immersion cooling infrastructure modules diminishes, one of the immersion cooling infrastructure modules 621 or 622 can be removed. In an analogous manner, the remaining one of the immersion cooling infrastructure modules can detect such a removal and can control its pump accordingly, such as by increasing the flow rate or operation of the pump. Additionally, communication external to the immersion cooling infrastructure module, such as to a centralized control device, can provide feedback regarding optimal placement within the tank 610. For example, through sensor measurement, optimal placement for a single immersion cooling infrastructure module may be in the place of the exemplary computing device 614, while multiple immersion cooling infrastructure modules may be placed in the manner analogous to that illustrated in FIG. 6.

Figure 7:
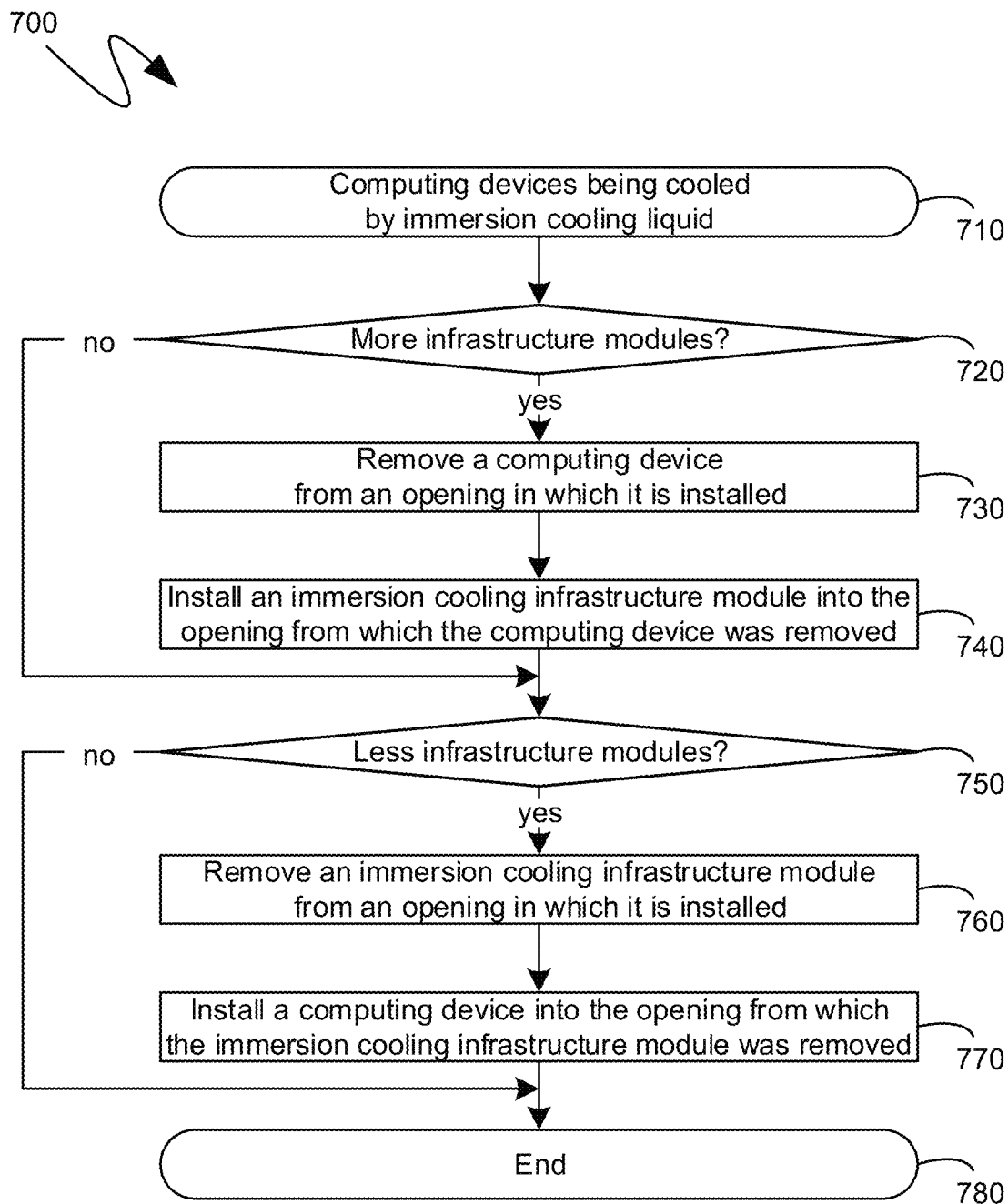
FIG. 7 is a flow diagram of an exemplary utilization of exemplary immersion cooling infrastructure modules having a compute device form factor.

Turning to FIG. 7, the exemplary flow diagram 700 shown therein illustrates an exemplary series of steps that can be performed utilizing an immersion cooling infrastructure module that can have a compute device form factor and can, thereby, be interchangeable with such compute devices within the openings provided for such computing devices. The exemplary flow diagram 700 can commence at step 710 with computing devices being cooled by being immersed in an immersion cooling liquid. At step 720, a determination can be made as to whether additional immersion cooling infrastructure modules may be appropriate, desired or needed. If, at step 720, additional immersion cooling infrastructure modules should be added, processing can proceed to step 730, and the computing device can be removed from an opening into which the computing device was installed, such as the openings illustrated and detailed previously. At step 740, an immersion cooling infrastructure module can be inserted into the same opening from which the computing device was removed.

In an analogous manner, at step 750, a decision can be made as to whether fewer immersion cooling infrastructure modules might be required, such as to end a temporary increase in the quantity of immersion cooling infrastructure modules. At step 760, an immersion cooling infrastructure module can be removed and, at step 770, a computing device can be inserted into the same opening from which the immersion cooling infrastructure module was removed. As can be seen, immersion cooling infrastructure modules having a compute device form factor can facilitate interchangeability of computing devices an immersion cooling infrastructure.

Figure 8:
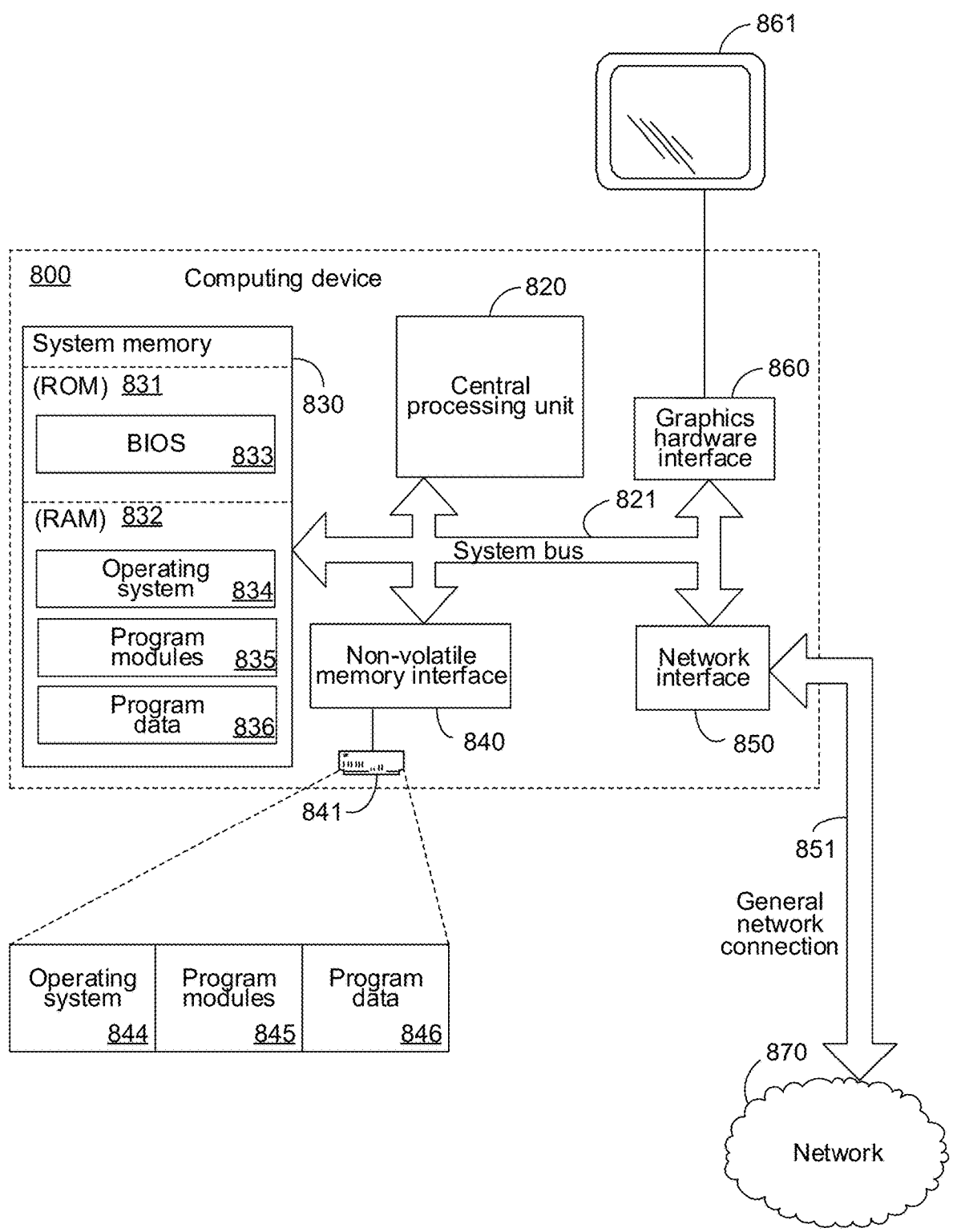
FIG. 8 is a diagram of an exemplary computing device that can provide control of an exemplary accelerated rack acclimator.

Turning to FIG. 8, an exemplary computing device 800 is illustrated. The exemplary computing device 800 can include, but is not limited to, one or more central processing units (CPUs) 820, a system memory 830, and a system bus 821 that couples various system components including the system memory to the processing unit 820. The system bus 821 may be any of several types of bus structures including a memory bus or memory controller, a peripheral bus, and a local bus using any of a variety of bus architectures. The computing device 800 can optionally include graphics hardware, including, but not limited to, a graphics hardware interface 860 and a display device 861, which can include display devices capable of receiving touch-based user input, such as a touch-sensitive, or multi-touch capable, display device. The display device 861 can further include a virtual reality display device, which can be a virtual reality headset, a mixed reality headset, an augmented reality headset, and other like virtual reality display devices. As will be recognized by those skilled in the art, such virtual reality display devices comprise either two physically separate displays, such as LCD displays, OLED displays or other like displays, where each physically separate display generates an image presented to a single one of a user's two eyes, or they comprise a single display device associated with lenses or other like visual hardware that divides the display area of such a single display device into areas such that, again, each single one of the user's two eyes receives a slightly different generated image. The differences between such generated images are then interpreted by the user's brain to result in what appears, to the user, to be a fully three-dimensional environment.

Returning to FIG. 8, depending on the specific physical implementation, one or more of the CPUs 820, the system memory 830 and other components of the computing device 800 can be physically co-located, such as on a single chip. In such a case, some or all of the system bus 821 can be nothing more than silicon pathways within a single chip structure and its illustration in FIG. 8 can be nothing more than notational convenience for the purpose of illustration.

The computing device 800 also typically includes computer readable media, which can include any available media that can be accessed by computing device 800 and includes both volatile and nonvolatile media and removable and non-removable media. By way of example, and not limitation, computer readable media may comprise computer storage media and communication media. Computer storage media includes media implemented in any method or technology for storage of content such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired content and which can be accessed by the computing device 800. Computer storage media, however, does not include communication media. Communication media typically embodies computer readable instructions, data structures, program modules or other data in a modulated data signal such as a carrier wave or other transport mechanism and includes any content delivery media. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 830 includes computer storage media in the form of volatile and/or nonvolatile memory such as read only memory (ROM) 831 and random access memory (RAM) 832. A basic input/output system 833 (BIOS), containing the basic routines that help to transfer content between elements within computing device 800, such as during start-up, is typically stored in ROM 831. RAM 832 typically contains data and/or program modules that are immediately accessible to and/or presently being operated on by processing unit 820. By way of example, and not limitation, FIG. 8 illustrates operating system 834, other program modules 835, and program data 836.

The computing device 800 may also include other removable/non-removable, volatile/nonvolatile computer storage media. By way of example only, FIG. 8 illustrates a hard disk drive 841 that reads from or writes to non-removable, nonvolatile magnetic media. Other removable/non-removable, volatile/nonvolatile computer storage media that can be used with the exemplary computing device include, but are not limited to, magnetic tape cassettes, flash memory cards, digital versatile disks, digital video tape, solid state RAM, solid state ROM, and other computer storage media as defined and delineated above. The hard disk drive 841 is typically connected to the system bus 821 through a non-volatile memory interface such as interface 840.

The drives and their associated computer storage media discussed above and illustrated in FIG. 8, provide storage of computer readable instructions, data structures, program modules and other data for the computing device 800. In FIG. 8, for example, hard disk drive 841 is illustrated as storing operating system 844, other program modules 845, and program data 846. Note that these components can either be the same as or different from operating system 834, other program modules 835 and program data 836. Operating system 844, other program modules 845 and program data 846 are given different numbers hereto illustrate that, at a minimum, they are different copies.

The computing device 800 may operate in a networked environment using logical connections to one or more remote computers. The computing device 800 is illustrated as being connected to the general network connection 851 (to the network 880) through a network interface or adapter 850, which is, in turn, connected to the system bus 821. In a networked environment, program modules depicted relative to the computing device 800, or portions or peripherals thereof, may be stored in the memory of one or more other computing devices that are communicatively coupled to the computing device 800 through the general network connection 851. It will be appreciated that the network connections shown are exemplary and other means of establishing a communications link between computing devices may be used.

The descriptions above include, as a first example, a system comprising: a tank; immersion cooling liquid in the tank; a rack comprising multiple adjacent openings of equivalent size and shape, at least a portion of the rack being immersible in the immersion cooling liquid; a computing device installed in a first opening of the multiple openings, the computing device, as installed in the first opening, being at least partially immersible in the immersion cooling liquid; and an immersion cooling infrastructure module installed into a second of the multiple openings adjacent the computing device, the immersion cooling infrastructure module comprising: an immersion cooling liquid pump; and an immersion cooling liquid filter; wherein the immersion cooling liquid pump and the immersion cooling liquid filter are arranged within the immersion cooling infrastructure module so that the immersion cooling liquid pump can pump the immersion cooling liquid through the immersion cooling liquid filter.

A second example is the system of the first example, wherein the immersion cooling infrastructure module further comprises a connector on a first side, the connector connecting the immersion cooling infrastructure module to electrical power.

A third example is the system of the second example, wherein the immersion cooling infrastructure module further comprises a handle on a second side opposite the first side.

A fourth example is the second of the second example, wherein the connector is a self-aligning blind mate connector.

A fifth example is the system of the second example, wherein each of the multiple adjacent openings individually comprises a rack connector providing power to devices installed within the multiple adjacent openings, and wherein further the connector of the immersion cooling infrastructure module mates with any of the rack connectors.

A sixth example is the system of the second example, wherein the connector also connects the immersion cooling infrastructure module to a computer network.

A seventh example is the system of the first example, wherein the rack is oriented such that the immersion cooling infrastructure module is inserted vertically downward into the first opening.

An eighth example is the system of the first example, wherein the immersion cooling liquid pump is located proximate to a bottom edge of the immersion cooling infrastructure module when the immersion cooling infrastructure module is in an operational orientation within the tank.

A ninth example is the system of the eighth example, wherein the immersion cooling liquid filter is located proximate to a top edge of the immersion cooling infrastructure module when the immersion cooling infrastructure module is in an operational orientation within the tank.

A tenth example is the system of the first example, wherein the immersion cooling liquid filter is integrated into the immersion cooling liquid pump.

An eleventh example is the system of the first example, wherein the immersion cooling infrastructure module further comprises piping between the immersion cooling liquid pump an immersion cooling liquid filter, the immersion cooling liquid pump pumping the immersion cooling liquid through the piping prior to pumping the immersion cooling liquid through the immersion cooling liquid filter.

A twelfth example is the system of the first example, wherein the immersion cooling infrastructure module further comprises an immersion cooling infrastructure controller circuit, wherein operation of the immersion cooling liquid pump is controlled by the immersion cooling infrastructure controller circuit.

A thirteenth example is the system of the twelfth example, wherein the immersion cooling infrastructure module further comprises a sensor providing sensor data to the immersion cooling infrastructure controller circuit, the sensor data being associated with a backpressure being experienced by the immersion cooling liquid pump, the immersion cooling infrastructure controller circuit controlling the operation of the immersion cooling liquid pump based at least in part on the provided sensor data.

A fourteenth example is the system of the twelfth example, further comprising: a second immersion cooling infrastructure module installed into a third of the multiple openings, the second immersion cooling infrastructure module comprising: a second immersion cooling liquid pump; a second immersion cooling liquid filter; and a second immersion cooling infrastructure controller circuit; wherein the immersion cooling infrastructure controller circuit controls the immersion cooling liquid pump based at least in part on communications received from the second immersion cooling infrastructure module.

A fifteenth example is the system of the first example, wherein the immersion cooling infrastructure module has a width that is a predefined fraction of a width of the second of the multiple openings.

A sixteenth example is the system of the fifteenth example, further comprising a second computing device, the second computing device installed alongside the immersion cooling infrastructure module in the second of the multiple openings.

A seventeenth example is the system of the first example, wherein the immersion cooling infrastructure module further comprises a second computing device supplementing a processing capacity of the computing device.

An eighteenth example is an immersion cooling infrastructure module comprising: an immersion cooling liquid pump; and an immersion cooling liquid filter; wherein the immersion cooling infrastructure module is installable into a first opening in a rack comprising multiple adjacent openings of equivalent size and shape, a second opening of the rack having installed therein a computing device; wherein the rack is at least partially immersible in an immersion cooling liquid, the immersion cooling liquid pump and the immersion cooling liquid filter being arranged within the immersion cooling infrastructure module so that the immersion cooling liquid pump can pump the immersion cooling liquid through the immersion cooling liquid filter.

A nineteenth example is a method of installing filtering comprising: removing a computing device from a first opening in a tank at least partially filled with an immersion cooling liquid into which the computing device was at least partially immersed, the tank further comprising other openings having other computing devices installed therein; installing, into the first opening, an immersion cooling infrastructure module comprising an immersion cooling liquid pump and an immersion cooling liquid filter, both arranged within the immersion cooling infrastructure module so that the immersion cooling liquid pump can pump the immersion cooling liquid through the immersion cooling liquid filter when installed.

A twentieth example is the method of the nineteenth example, further comprising: removing the immersion cooling infrastructure module; and installing, into the first opening, a second computing device; wherein the tank comprises a second immersion cooling infrastructure module installed in a second opening.

As can be seen from the above descriptions, an immersion cooling infrastructure module having a compute device form factor has been presented. In view of the many possible variations of the subject matter described herein, we claim as our invention all such embodiments as may come within the scope of the following claims and equivalents thereto.

We claim:

1. A system comprising:
    a tank;
    immersion cooling liquid in the tank;
    a rack comprising multiple adjacent openings of equivalent size and shape, at least a portion of the rack being immersible in the immersion cooling liquid;
    a computing device installed in a first opening of the multiple openings, the computing device, as installed in the first opening, being at least partially immersible in the immersion cooling liquid; and
    an immersion cooling infrastructure module installed into a second of the multiple openings adjacent the computing device, the immersion cooling infrastructure module comprising:
        an immersion cooling liquid pump; and
        an immersion cooling liquid filter;
    wherein the immersion cooling liquid pump and the immersion cooling liquid filter are arranged within the immersion cooling infrastructure module so that the immersion cooling liquid pump can pump the immersion cooling liquid through the immersion cooling liquid filter.

2. The system of claim 1, wherein the immersion cooling infrastructure module further comprises a connector on a first side, the connector connecting the immersion cooling infrastructure module to electrical power.

3. The system of claim 2, wherein the immersion cooling infrastructure module further comprises a handle on a second side opposite the first side.

4. The system of claim 2, wherein the connector is a self-aligning blind mate connector.

5. The system of claim 2, wherein each of the multiple adjacent openings individually comprises a rack connector providing power to devices installed within the multiple adjacent openings, and wherein further the connector of the immersion cooling infrastructure module mates with any of the rack connectors.

6. The system of claim 2, wherein the connector also connects the immersion cooling infrastructure module to a computer network.

7. The system of claim 1, wherein the rack is oriented such that the immersion cooling infrastructure module is inserted vertically downward into the first opening.

8. The system of claim 1, wherein the immersion cooling liquid pump is located proximate to a bottom edge of the immersion cooling infrastructure module when the immersion cooling infrastructure module is in an operational orientation within the tank.

9. The system of claim 1, wherein the immersion cooling liquid filter is located proximate to a top edge of the immersion cooling infrastructure module when the immersion cooling infrastructure module is in an operational orientation within the tank.

10. The system of claim 1, wherein the immersion cooling liquid filter is integrated into the immersion cooling liquid pump.

11. The system of claim 1, wherein the immersion cooling infrastructure module further comprises piping between the immersion cooling liquid pump an immersion cooling liquid filter, the immersion cooling liquid pump pumping the immersion cooling liquid through the piping prior to pumping the immersion cooling liquid through the immersion cooling liquid filter.

12. The system of claim 1, wherein the immersion cooling infrastructure module further comprises an immersion cooling infrastructure controller circuit, wherein operation of the immersion cooling liquid pump is controlled by the immersion cooling infrastructure controller circuit.

13. The system of claim 12, wherein the immersion cooling infrastructure module further comprises a sensor providing sensor data to the immersion cooling infrastructure controller circuit, the sensor data being associated with a backpressure being experienced by the immersion cooling liquid pump, the immersion cooling infrastructure controller circuit controlling the operation of the immersion cooling liquid pump based at least in part on the provided sensor data.

14. The system of claim 12, further comprising:
    a second immersion cooling infrastructure module installed into a third of the multiple openings, the second immersion cooling infrastructure module comprising:
        a second immersion cooling liquid pump;
        a second immersion cooling liquid filter; and
        a second immersion cooling infrastructure controller circuit;
    wherein the immersion cooling infrastructure controller circuit controls the immersion cooling liquid pump based at least in part on communications received from the second immersion cooling infrastructure module.

15. The system of claim 1, wherein the immersion cooling infrastructure module has a width that is a predefined fraction of a width of the second of the multiple openings.

16. The system of claim 15, further comprising a second computing device, the second computing device installed alongside the immersion cooling infrastructure module in the second of the multiple openings.

17. The system of claim 1, wherein the immersion cooling infrastructure module further comprises a second computing device supplementing a processing capacity of the computing device.

18. An immersion cooling infrastructure module comprising:
    an immersion cooling liquid pump; and
    an immersion cooling liquid filter;
    wherein the immersion cooling infrastructure module is installable into a first opening in a rack comprising multiple adjacent openings of equivalent size and shape, a second opening of the rack having installed therein a computing device;
    wherein the rack is at least partially immersible in an immersion cooling liquid, the immersion cooling liquid pump and the immersion cooling liquid filter being arranged within the immersion cooling infrastructure module so that the immersion cooling liquid pump can pump the immersion cooling liquid through the immersion cooling liquid filter.

19. A method of installing filtering comprising: removing a computing device from a first opening in a rack in a tank at least partially filled with an immersion cooling liquid into which the computing device was at least partially immersed, the rack further comprising other openings having other computing devices installed therein; and installing, into the first opening, an immersion cooling infrastructure module comprising an immersion cooling liquid pump and an immersion cooling liquid filter, both arranged within the immersion cooling infrastructure module so that the immersion cooling liquid pump can pump the immersion cooling liquid through the immersion cooling liquid filter when installed.

20. The method of claim 19, further comprising:
removing the immersion cooling infrastructure module; and
installing, into the first opening, a second computing device;
wherein the tank comprises a second immersion cooling infrastructure module installed in a second opening.

\* \* \* \* \*